United States Patent [19]

Wermuth

[11] 4,415,866
[45] Nov. 15, 1983

[54] CIRCUIT FOR DYNAMIC COMPRESSION AND/OR EXPANSION

[75] Inventor: Jürgen Wermuth, Peine-Stederdorf, Fed. Rep. of Germany

[73] Assignee: Licentia Patent-Verwaltungs-GmbH, Frankfurt am Main, Fed. Rep. of Germany

[21] Appl. No.: 324,661

[22] Filed: Nov. 24, 1981

[30] Foreign Application Priority Data

Nov. 27, 1980 [DE] Fed. Rep. of Germany ....... 3044661

[51] Int. Cl.³ .......................... H03G 3/30; G06G 7/24
[52] U.S. Cl. ................................... 330/278; 330/284; 330/86; 328/145; 333/14
[58] Field of Search .......................... 333/14; 328/145; 307/493; 330/86, 126, 149, 278, 284, 302

[56] References Cited

U.S. PATENT DOCUMENTS 4,225,794 9/1980 Buff ..................................... 328/145

FOREIGN PATENT DOCUMENTS 2743279 4/1979 Fed. Rep. of Germany ........ 333/14

Primary Examiner—James B. Mullins
Assistant Examiner—Gene Wan
Attorney, Agent, or Firm—Spencer & Frank

[57] ABSTRACT

In a circuit for the automatic dynamic compression or expansion of a signal, the circuit presenting a useful signal path containing a first variable gain member which is electronically controllable for varying the transmission factor between the circuit input and output, a branch path connected at one point to the useful signal path and containing a control voltage generator for generating a control voltage from the signal at such point in the useful signal path, and a second variable gain member which is connected in the branch path and which is electronically controllable for varying the transmission factor exhibited by the branch path, with the transmission factor of the useful signal path being controlled to have a value dependent on the value of the control voltage and a counterregulation of the transmission factor of the branch path being effected relative to the transmission factor variation imparted to the useful signal path, the useful signal path includes a device causing the signal at one point along that path to have a value proportional to the logarithm of the signal at the circuit input, the branch path has its input point connected to the one point of the useful signal path, each variable gain member has an antilogarithmic transmission factor, and the output of the control voltage generator serves to vary the gain of each said variable gain member as an exponential function of the control voltage.

10 Claims, 4 Drawing Figures

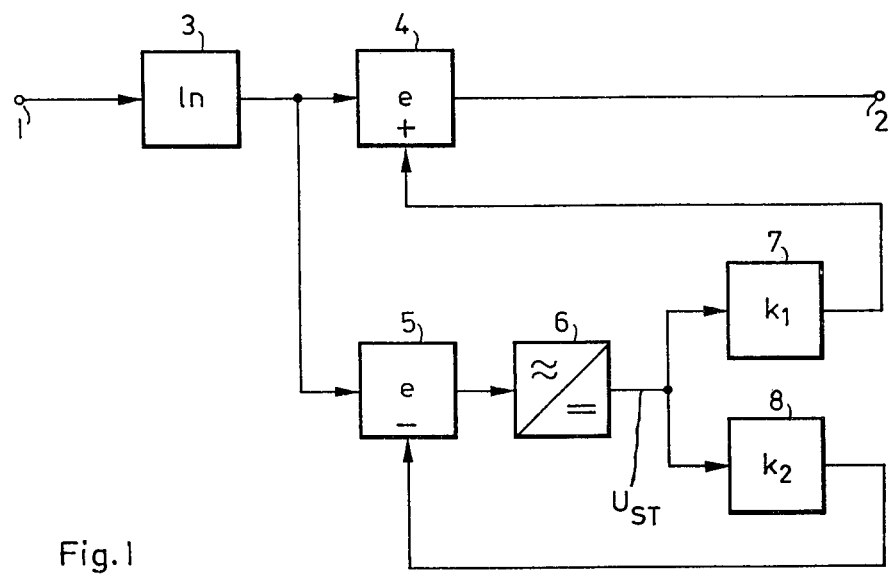
Fig. 1
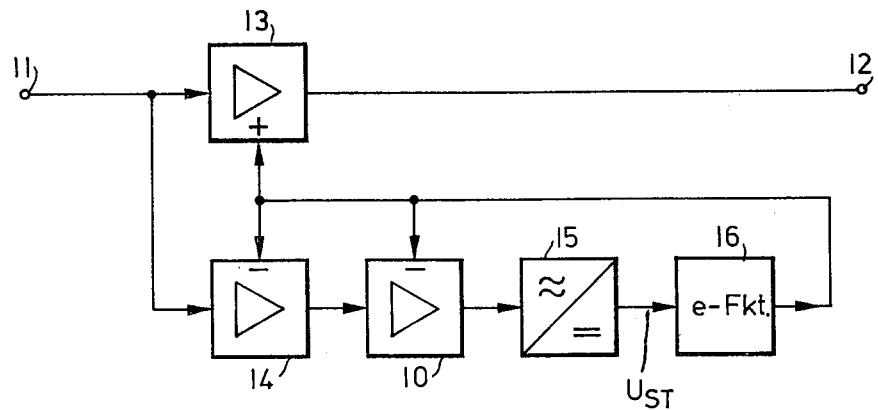
Fig. 2 (PRIOR ART EXPANSION CIRCUIT)

CIRCUIT FOR DYNAMIC COMPRESSION AND/OR EXPANSION

BACKGROUND OF THE INVENTION

The present invention relates to a dynamic compression/expansion circuit of the general type disclosed in U.S. Pat. No. 3,969,680. A characteristic of the compression of expansion curve which is "dB linear," i.e. is a linear function of the logarithm of the input amplitude, can be achieved in such a circuit if the setting members used in that system have the same control characteristic in the useful signal path and in the branch path of the circuit.

U.S. Pat. No. 4,278,945 discloses, in connection with such a circuit, the use of linear setting members and a transfer member connected ahead of the setting members and having an exponential transmission factor. This is of great advantage for the dynamic behavior of the circuit arrangement.

U.S. Pat. No. 3,969,680 also discloses that the interconnection of a plurality of amplifiers with variable transmission factor into a cascade circuit makes possible the achievement of different degrees of compression. If the circuits shown in FIGS. 4 and 6 of that patent are used, it is possible, for example, to achieve a degree of compression of 1:1.5. However, the manufacturing costs for such circuits become considerably higher because they require an additional amplifier and an additional setting member.

SUMMARY OF THE INVENTION

It is an object of the present invention to give such a compander circuit any desired degrees of dB-linear compression in a simple manner while maintaining the design costs of the setting members low.

The above and other objects are achieved, according to the invention, in a circuit for the automatic dynamic compression or expansion of a signal between the input and output of the circuit, the circuit presenting a useful signal path connected between its input and output and containing a first variable gain member which is electronically controllable for varying the transmission factor between the circuit input and output, the circuit also presenting a branch path connected at one point to the useful signal path and containing a control voltage generator for generating a control voltage from the signal at such point in the useful signal path, a second variable gain member which is connected in the branch path and which is electronically controllable for varying the transmission factor exhibited by the branch path, and means connecting the output of the control voltage generator to the variable gain members for causing the transmission factor of the useful signal path to have a value dependent on the value of the control voltage and for effecting a counter-regulation of the transmission factor of the branch path relative to the tranmission factor variation imparted to the useful signal path, by providing the useful signal path with means causing the signal at one point along the path to have a value proportional to the logarithm of the signal at the circuit input, connecting the input point of the branch path to the one point of the useful signal path, giving each variable gain member an antilogarithmic tranmission factor, and causing the means connecting the output of the control voltage generator to vary the gain of each variable gain member as an exponential function of the control voltage.

In the circuit according to the present invention any desired degrees of compression can be realized in a simple manner in that control voltages at levels which differ by a constant factor are fed to the controlled variable gain members in the useful signal path and in the branch path. In the selected arrangement, such a constant factor has a linear effect on the degree of compression. The variable gain members employed, which have a control characteristic corresponding to an exponentional function of the control voltage, can be designed much more easily than those having a linear characteristic as employed in the prior art. For example, use can be made of the known fact that the collector current of a transistor changes in dependence on its base voltage according to an exponential function.

BRIEF DESCRIPTION OF THE DRAWINGS

FIG. 1 is a block circuit diagram of an expander according to the invention.

FIG. 2 is a block circuit diagram of a prior art expansion circuit.

DESCRIPTION OF THE PREFERRED EMBODIMENTS

Figure 3:
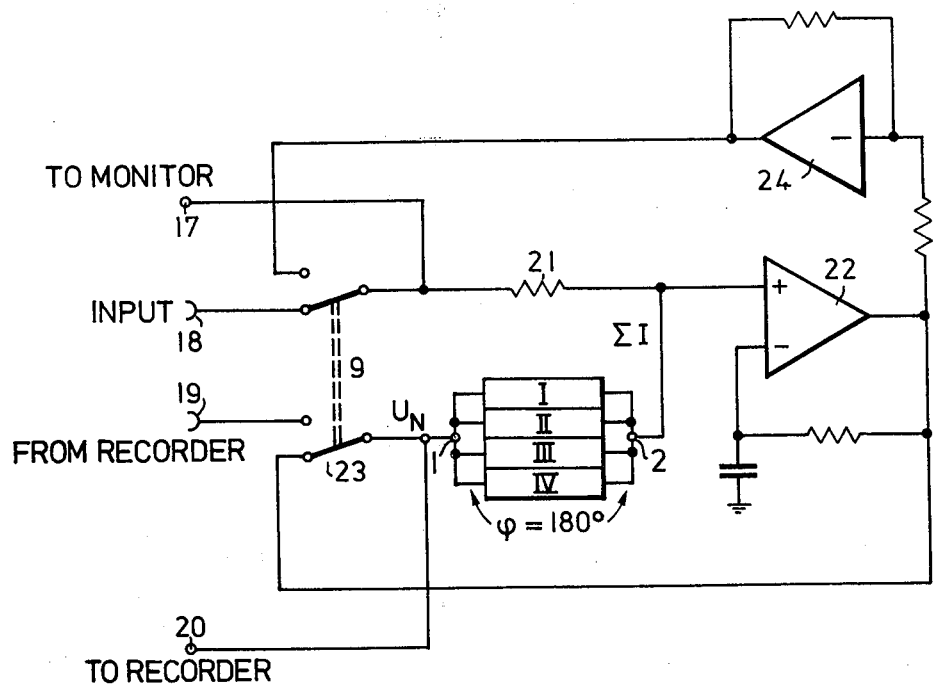
FIG. 3 is a block circuit diagram of a compander circuit according to the invention which can be switched between expansion and compression operation.

First, the prior art expansion circuit shown in FIG. 2 will be described. An alternating voltage signal fed in at the input terminal 11 is transmitted via a variable gain member 13 to an output terminal 12. From the input of the member 13, the same signal is fed to a branch path including two variable gain members 14 and 10. From the output of the member 10, a control signal $U_{ST}$ is derived by means of a control voltage generator 15. The control signal $U_{ST}$ is influenced in an exponential function member 16 and is fed to linear setting elements in the members 13, 14 and 10. The setting elements, not shown in detail in FIG. 2, are arranged in such a manner that the transmission factor in the main path is influenced in a positive sense and is influenced in the branch path in the sense of an opposite regulation, or a counter-regulation. The circuit member 16 can be omitted if the setting elements in the members 13, 14 and 10 themselves have an exponential characteristic.

In the prior art circuit shown in FIG. 2, three linear setting elements are provided in the members 13, 14 and 10. These can be manufactured to satisfy the requirements for precision placed on companders only at considerable expense. Special circuits are required, for example, to provide temperature compensation for the setting members.

FIG. 1 shows a circuit for an expander based on the invention. The useful signal is fed to an input terminal 1 and the expanded output signal can be obtained at the output terminal 2. Initially, the useful signal is delivered to a logarithm function generator 3 to produce a signal proportional to the logarithm of the input useful signal. At the output of the logarithm member 3, the alternative voltage signal is branched to the main path and the branch path. In the main path there follows a controllable gain member 4 and in the branch path a controllable gain member 5.

A control voltage $U_{ST}$ is derived from the output signal of the controllable member 5 by means of a control voltage generator 6. At the output of the control voltage generator 6 the control voltage is fed, on the one hand, via a member 7 having a constant transmission factor $k_1$, to the controllable member 4 in the main path and, on the other hand, via a member 8 having a constant transmission factor $k_2$, to the controllable member 5 in the branch path. The control signal is thus fed to the members 4 and 5 with amplitudes which have a constant ratio of $k_1/k_2$.

The members 4 and 5 are designed as follows:

1. With an unchanging control signal each member 4 and 5 has an antilogarithmic transmission characteristic for the alternating voltage signal which it receives; and
2. The transmission factor of each member changes as an exponential function of the direct voltage control signal.

When the circuit is put into operation, the two characteristics of the circuit are superposed. The members 4 and 5 can be produced in a very simple manner, as will be demonstrated below.

FIG. 3 shows a circuit arrangement for a compander which can be switched between compression operation and expansion operation by means of a switch 9. This is a compander circuit in which the dynamic behavior of the signal to be processed is influenced when it is separated into four staggered frequency bands. The dynamic behavior of the useful signal is influenced by members I through IV, each acting on a respective frequency band. Each of members I through IV is constituted by a respective circuit according to FIG. 1 and, in addition, frequency filters which need not be discussed herein in detail.

In the illustrated position of switch 9, the circuit operates as compressor. The useful signal at the input 18 is delivered, via a resistor 21, an operational amplifier 22 and the switch contact 23 of the switch 9, to the output terminal 20, for example to a magnetic tape recorder. The expansion circuits I and IV are here disposed in the feedback path of the operational amplifier 22 so that a compression characteristic results which is inverse to the expansion characteristic. A feedback effect for circuit members I through IV is achieved in that the output signals of these circuit members have a phase shift of 180° with respect to the input signals, which corresponds to an inversion.

To operate the circuit of FIG. 3 as an expander, the switch 9 is placed in the nonillustrated position. Now a useful signal which comes, for example, from a magnetic tape recorder, is present at the input terminal 19 and is conducted via the switching contact 23 and the circuit members I through IV to the noninverting input of the operational amplifier 22. The operational amplifier must now operate as an adder for the alternating currents coming from the circuit members I through IV, for which purpose it is provided with a feedback connection provided by an operational amplifier 24 connected as an inverter and disposed between the output and noninverting input of the operational amplifier 22.

The end of resistor 21 directed toward the switch 9 is connected with an output terminal 17 to which a monitor may be connected.

Figure 4:
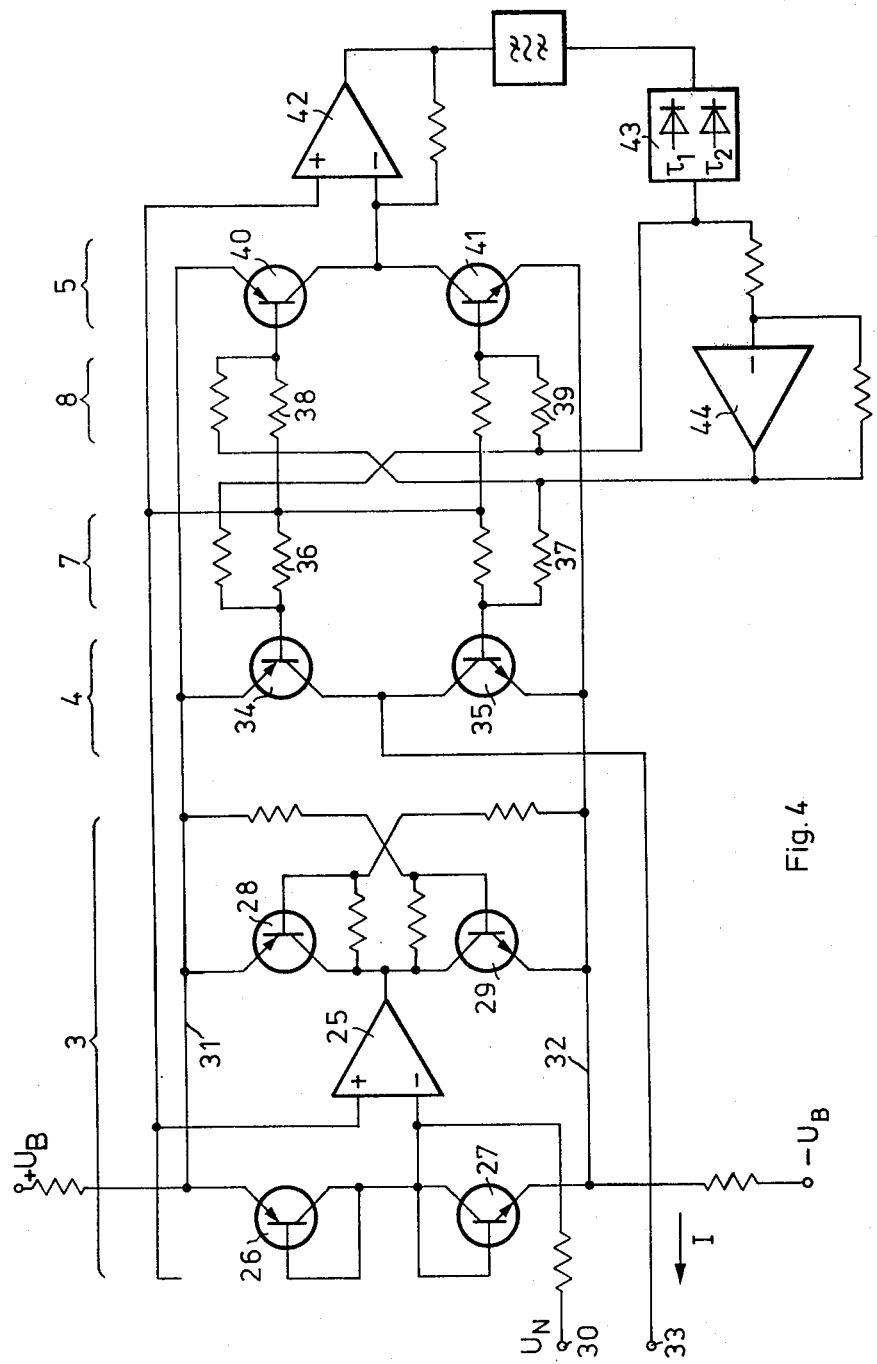
FIG. 4 is a circuit diagram of a specific embodiment of the circuit according to the invention.

FIG. 4 shows one preferred embodiment of the circuit according to FIG. 1. The logarithm function member 3 of FIG. 1 is constructed, in FIG. 4, with an operational amplifier 25 and transistors 26 and 27 connected in the feedback path of the operational amplifier 25. Further transistors 28 and 29 effect a shift in level of the output signal from the operational amplifier 25 and serve to compensate the $U_{BE}$ voltages of the other transistors which are part of the circuit.

At the input terminal 30 of the circuit, corresponding to terminal 1 of FIG. 1, the useful input signal $U_N$ is fed to the inverting input of the operational amplifier 25. The transistors 26 and 27 in the feedback path of the operational amplifier 25 cause the member 3 to have a logarithmic transmission characteristic so that the output signal appearing on lines 31 and 32 is proportional to the logarithm of the useful input signal. The signals on lines 31 and 32 are identical in phase.

The signal on lines 31 and 32 are conducted to the setting member 4 which includes transistors 34 and 35 as well as to the setting member 5 composed of transistors 40 and 41. The respective upper transistors 34 and 40, which are pnp transistors, serve to influence the positive halfwaves of the signal and the lower transistors 35 and 41, which are npn transistors, serve to process the negative halfwaves so that the respectively superposed transistors together form a complete setting member.

The setting member 5 belongs to the branch path in which the control signal is generated. The collector currents of the transistors 40 and 41 are combined in an operational amplifier 42. The output signal from the operational amplifier 42 is fed via a bandpass filter to a threshold value rectifier having a discharging time constant $\tau_1$ and a charging time constant $\tau_2$. At the output of the rectifier 43 there is available the control signal for the setting members. Thus members 42 and 43, together with the bandpass filter, correspond to the control voltage generator 6 of FIG. 1. The control signal is fed via an inverting amplifier 44 to the transistors of the controllable members 4 and 5 at their respective bases, each time via a voltage divider 36, 37, 38 and 39 which gives a constant factor. The collector currents of the transistors 34, and 35 and 40, 41 behave, in dependence on the applied base voltage, according to an exponential function. Voltage dividers 36 and 39 are connected at the input of amplifier 44, while dividers 37 and 38 are connected at the output of that amplifier.

The collector currents of the two transistors of one setting member 4 are summed and constitute, at terminal 33, the output signal of the controllable gain member.

The members 4 and 5 are controlled, according to FIG. 1, in inverse ways. To control a setting member, the control signal is fed once noninverted and then inverted by means of inverter 44. The different transistors require these different control signals.

The members 7 and 8 in FIG. 1 which have a constant transmission factor are provided by voltage dividers 36 and 37, constituting member 7, and 38 and 39, constituting member 8, respectively, which are connected ahead of the bases of the transistors 34, 35, 40 and 41, respectively.

The useful signal in lines 31 and 32 is present each time at the emitters of the transistors of the members 4 and 5. In this connection, the members 4 and 5 exhibit an antilogarithmic transmission characteristic for the useful signal. If, for example, the voltage across the bases of the transistors of members 4 and 5 is assumed to be constant and only the change in the useful signal is considered, the useful signal appears at the output of those members, based on the sum of the collector currents of the transistors of those members, again with the original, nonlogarithmic level relationships.

The members 4 and 5, which are each constructed of two transistors, combine two characteristics in themselves:

1. they each constitute a transfer member having an antilogarithmic transmission factor; and
2. they have a control characteristic which corresponds to an exponential function.

As shown in FIG. 4, the members 4 and 5 can be designed with very simple means. Linear members as disclosed, for example, in German Offenlegungsschrift [laid-open application] No. 2,847,436 are much more complicated by comparison.

At the output terminal 33 of the circuit of FIG. 4, a current can be obtained which can be converted by the circuit of FIG. 3 into a signal voltage and again a plurality of currents from identical circuits for the various frequency bands according to FIG. 3 can be combined.

The degree of compression in the circuit of FIG. 4 can be set in a simple manner as desired by suitably dimensioning the voltage dividers 36 through 39. As already stated in connection with FIG. 1, the factors occurring there are included in a directly linear manner in the degree of expansion or compression of the circuit.

The present invention is not limited to the described embodiment. For example, a member with an antilogarithmic transmission characteristic but with a control characteristic which deviates from the exponential function can also be used for the controlled transfer members. The required control characteristic, i.e. the exponential function, can then be produced by means of correspondingly designed characteristic generators for the control signal. In such a case, the characteristic generator must be considered as being part of the setting member.

It will be understood that the above description of the present invention is susceptible to various modifications, changes and adaptations, and the same are intended to be comprehended within the meaning and range of equivalents of the appended claims.

What is claimed is:

1. In a circuit for the automatic dynamic compression or expansion of a signal between the input and output of the circuit, the circuit presenting a useful signal path connected between its input and output and containing a first variable gain member which has a control input and which is electronically controllable in response to a first control signal at its control input for varying the transmission factor between the circuit input and output, the circuit also presenting a branch path having an input point connected to the useful signal path and containing a control voltage generator for generating a control voltage from the signal at such point in the useful signal path, a second variable gain member which is connected in the branch path and which has a control input and which is electronically controllable in response to a second control signal at its control input for varying the transmission factor exhibited by the branch path, and means connecting the output of the control voltage generator to the variable gain members supplying respective first and second control signals thereto for causing the transmission factor of the useful signal path to have a value dependent on the value of the control voltage and for effecting a counterregulation of the transmission factor of the branch path relative to the transmission factor variation imparted to the useful signal path, the improvement wherein:

said useful signal path includes means causing the signal at one point along said path to have a value proportional to the logarithm of the signal at said circuit input;

said branch path has its input point connected to said one point of said useful signal path;

each of said variable gain members constitutes means having a transmission factor which is antilogarithmic and which varies as an exponential function of the control voltage; and said means connecting the output of the control voltage generator serve to cause the first and second control signals to have respectively different values.

2. Circuit as defined in claim 1 wherein each said variable gain member comprises a bipolar transistor connected such that its collector current changes, in dependence on its base-emitter voltage, according to the exponential function.

3. Circuit as defined in claim 2 wherein each said variable gain member comprises one npn transistor and one pnp transistor, said two transistors are connected to receive respectively opposite polarities of the control voltage, the emitters of said transistors are connected to receive the useful signal, and the collector currents of said two transistors are added and constitute the output signal of said first variable gain member.

4. Circuit as defined in claim 3 wherein the collectors of said transistors are connected together, and further comprising an adder circuit having an input connected to the connected-together collectors of said transistors.

5. Circuit as defined in claim 3 wherein said means connecting the output of the control voltage generator comprise two voltage dividers associated with each said variable gain member and connected between said control voltage generator and the bases of said transistors of the associated variable gain member.

6. Circuit as defined in claim 5 wherein said first and second variable gain members are of identical design.

7. Circuit as defined in claim 6 wherein the dividing ratios of said voltage dividers of each said variable gain member are identical.

8. Circuit as defined in claim 7 wherein the dividing ratios of said voltage dividers of said first variable gain member differ from the dividing ratios of said voltage dividers of said second variable gain member by a constant factor.

9. Circuit arrangement as defined in claim 3 wherein the emitters of said transistors receive the useful signal for compensation of the base-emitter voltages of said transistors of said variable gain members offset with respect to one another by a constant voltage value.

10. Circuit arrangement as defined in claim 1 wherein said means connecting the output of the control voltage generator cause the values of the first and second control signals to have a constant ratio.

* * * * *